(12) United States Patent
Sumi

(10) Patent No.: US 9,084,384 B2
(45) Date of Patent: Jul. 14, 2015

(54) COMPONENT SUPPLY METHOD IN COMPONENT MOUNTING DEVICE

(75) Inventor: Hideki Sumi, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 238 days.

(21) Appl. No.: 13/639,720

(22) PCT Filed: Apr. 13, 2011

(86) PCT No.: PCT/JP2011/002193
§ 371 (c)(1),
(2), (4) Date: Oct. 5, 2012

(87) PCT Pub. No.: WO2011/132386
PCT Pub. Date: Oct. 27, 2011

(65) Prior Publication Data
US 2013/0028701 A1    Jan. 31, 2013

(30) Foreign Application Priority Data
Apr. 19, 2010 (JP) ................................. 2010-095686

(51) Int. Cl.
*H05K 3/30* (2006.01)
*B23P 19/00* (2006.01)
*H05K 13/04* (2006.01)

(52) U.S. Cl.
CPC ................................. *H05K 13/0417* (2013.01)

(58) Field of Classification Search
USPC ............................. 29/832, 834, 836, 739, 740
See application file for complete search history.

(56) References Cited

U.S. PATENT DOCUMENTS

| 6,941,646 | B2 * | 9/2005 | Suhara | 29/740 |
| 8,271,125 | B2 * | 9/2012 | Kretsis | 700/214 |
| 8,849,442 | B2 * | 9/2014 | Ishimoto | 700/121 |
| 2002/0184755 | A1 * | 12/2002 | Suhara | 29/833 |
| 2003/0098798 | A1 * | 5/2003 | Kato | 340/679 |
| 2005/0190956 | A1 * | 9/2005 | Fujii et al. | 382/141 |
| 2005/0209882 | A1 * | 9/2005 | Jacobsen et al. | 705/2 |
| 2006/0136786 | A1 * | 6/2006 | Nonaka et al. | 714/39 |

FOREIGN PATENT DOCUMENTS

| CN | 1778157 A | 5/2006 |
| CN | 101998819 A | 3/2011 |

(Continued)

OTHER PUBLICATIONS

International Search Report for PCT/JP2011/002193 dated May 17, 2011.

(Continued)

*Primary Examiner* — David Angwin
(74) *Attorney, Agent, or Firm* — Pearne & Gordon LLP

(57) ABSTRACT

A method includes: detecting a splice by splicing in a tape feed process of supplying a component by pitch-feeding the carrier tape; and performing data processing of writing splice component information over in-use component information when the splice is detected, and rewriting only a number of remaining component of the in-use component information by means of the number of remaining component of the splice component information without issuing a component depletion alarm when the splice is not detected and when the number of remaining component in the in-use component information has decreased to a predetermined value.

3 Claims, 7 Drawing Sheets

(56) References Cited

FOREIGN PATENT DOCUMENTS

| | | | |
|---|---|---|---|
| JP | 2005-116599 A | | 4/2005 |
| JP | 2006-216703 A | | 8/2006 |
| JP | 2006216703 | * | 8/2006 |
| JP | 2007-188929 A | | 7/2007 |
| JP | 2008-078235 A | | 4/2008 |

OTHER PUBLICATIONS

Office Action issued in corresponding Chinese Patent Application No. 201180019853.4 dated Jul. 3, 2014.

* cited by examiner

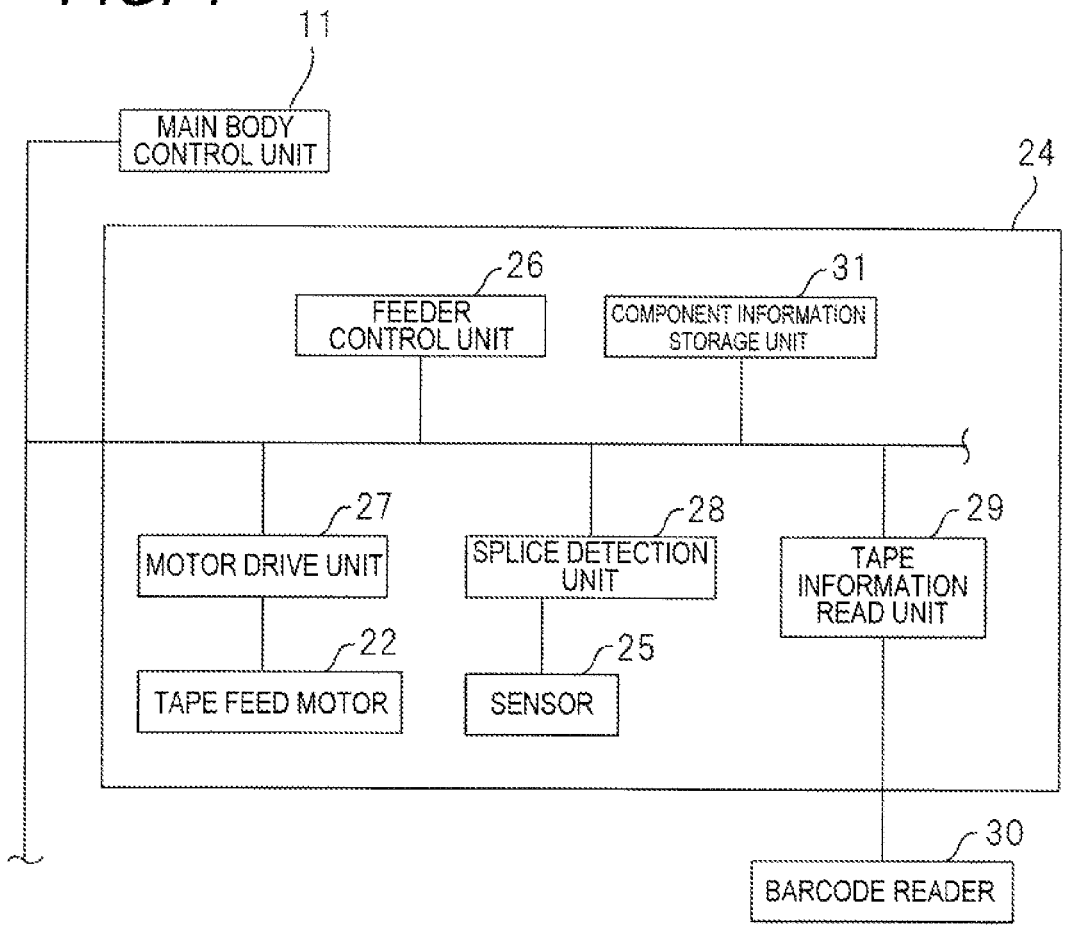

COMPONENT SUPPLY METHOD IN COMPONENT MOUNTING DEVICE

TECHNICAL FIELD

The present invention relates to a component supply method for supplying components by a tape feeder arranged in a component supply unit of a component mounting device.

BACKGROUND ART

A tape feeder is frequently used as a component supply device in a component mounting device. The tape feeder feeds a carrier tape which holds components from a tape reel and pitch-feeds the carrier tape in synchronism with timing for mounting the component. As a reel exchange operation performed when component depletion occurs while the tape feeder is performing mounting operation, a splicing method for splicing carrier tapes with each other has been adopted. In the method, a tail end of a carrier tape already loaded and a head of a new carrier tape are spliced together. Consequently, leading end placing operation for placing the leading end of the new tape on the tape feeder and positioning the tape can thereby be omitted. Accordingly, it is possible to omit a wasteful time caused by stopping a mounting device every time components become depleted. Further, a splice between two carrier tapes is automatically detected at a specific position on the tape feeder, thereby providing the following advantage. That is, automatic detection of the splice can be applied to managing the number of remaining components and managing a component supply history in the component supply, such as prediction of timing at which operation for splicing a current carrier tape to the next carrier tape becomes necessary (see, for example, Patent Document 1).

Specifically, in a component supply system using tape feeders, component information about a carrier tape unreeled from an individual tape reel and mounted on a corresponding tape feeder is stored in a component information storage unit in real time. The component information includes, for example, a reel ID code for specifying the carrier tape, the number of remaining components not picked up yet, etc. Data rewriting processing for the stored contents on detection of a splice in the carrier tape as a trigger signal. The data rewriting processing includes, for example, operation for writing data by a reel ID code which specifies a carrier tape to be newly spliced, operation for resetting the number of remaining components, etc. Accordingly, it is possible to automatically perform highly reliable component supply management without inconvenience to a machine operator.

RELATED ART DOCUMENTS

Patent Documents

Patent Document 1: JP-A-2005-116599

SUMMARY OF THE INVENTION

Problem to be Solved by the Invention

However, in a related-art technique for managing the supply of components on detection of a splice in the carrier tape as a trigger signal such as the above-described example, inconvenience described below may occur depending on the accuracy of detection of the splice. Specifically, the splice is detected by sensing a splicing tape used for splicing two carrier tapes with an optical sensor. However, the splice is not always detected with 100% accuracy because of various factors, such as an optical characteristic of the splicing tape and sensitivity adjustment of an optical sensor. Consequently, a detection error, in which a splice detection signal is not output even when a splice has passed through a detection position, may occur. In such a case, rewriting a reel ID code and the number of remaining components is not correctly performed in spite of splicing operation being correctly performed. For this reason, the tape feeder enters a state in which the tape feeder cannot perform normal component supply operation.

Specifically, when the number of remaining components stored in a component information storage unit has decreased to a predetermined value, the component mounting device is halted while a component depletion warning has been output. Further, since the reel ID code is not rewritten, it is impossible to perform operation for splicing the current carrier tape to another carrier tape that will become the next object of splicing. As described above, in the component supply method for the related art component mounting device, when erroneous detection of a splice in a carrier tape occurs, there may be a case where the component mounting device cannot continually perform operation, which deteriorates availability factor of the component mounting device.

An object of the present invention is to provide a component supply method in a component mounting device capable of continually performing operation and maintaining availability factor even when erroneous detection of a splice in a carrier tape has occurred.

Means for Solving the Problem

The present invention provides a component supply method in a component feeding device that picks up a component from a component supply unit by a mount head and that mounts the component on a substrate, in which a carrier tape which holds the components is loaded into a tape feeder arranged in the component supply unit and the carrier tape is pitch-fed while splicing operation for splicing a carrier tape already loaded and a carrier tape to be newly fed in the tape feeder is repeatedly performed, whereby the component is supplied to a pickup position for the mount head, the component mounting device including: a splice detection unit configured to detect a splice made through splicing performed during the splicing operation; a component information storage unit configured to individually store first component information including a number of remaining component and component type information of components held in the carrier tape already loaded and second component information including a number of remaining component and component type information of components held in a carrier tape to be newly fed; and a component depletion notifying unit configured to issue a component depletion alarm when the number of remaining component of the carrier tape in the first component information has decreased to a predetermined value, the method including: a splice detection step of detecting the splice in a tape feed process of pitch-feeding the carrier tape to supply the component; a component information rewrite step of writing the second component information over the first component information when the splice is detected; and a limited component information rewrite step of rewriting only the number of remaining component of the first component information by the number of remaining component of the second component information without issuing the component depletion alarm when the splice is not detected and when the number of remaining component in the first component information has decreased to a predetermined value.

Advantages of the Invention

According to the present invention, a method includes: detecting a splice by splicing in a tape feed process of supplying the component by pitch-feeding the carrier tape; and performing data processing of writing second component information that is splice component information over first component information that is information about components being used when the splice is detected, and rewriting only the number of remaining component of the first component information by the number of remaining component of the second component information without issuing the component depletion alarm when the splice is not detected and when the number of remaining component in the first component information has decreased to a predetermined value. As a result, even when erroneous detection of a splice in a carrier tape has occurred after normal performance of splicing, it is possible to continually perform operation of the component mounting device.

BRIEF DESCRIPTION OF THE DRAWINGS

FIG. 4 is a block diagram showing a configuration of a control system of the tape feeder of the embodiment of the present invention.

FIG. 5 is a structural descriptive view of component information adopted by the component mounting device of the embodiment of the present invention.

MODE FOR CARRYING OUT THE INVENTION

Figure 1:
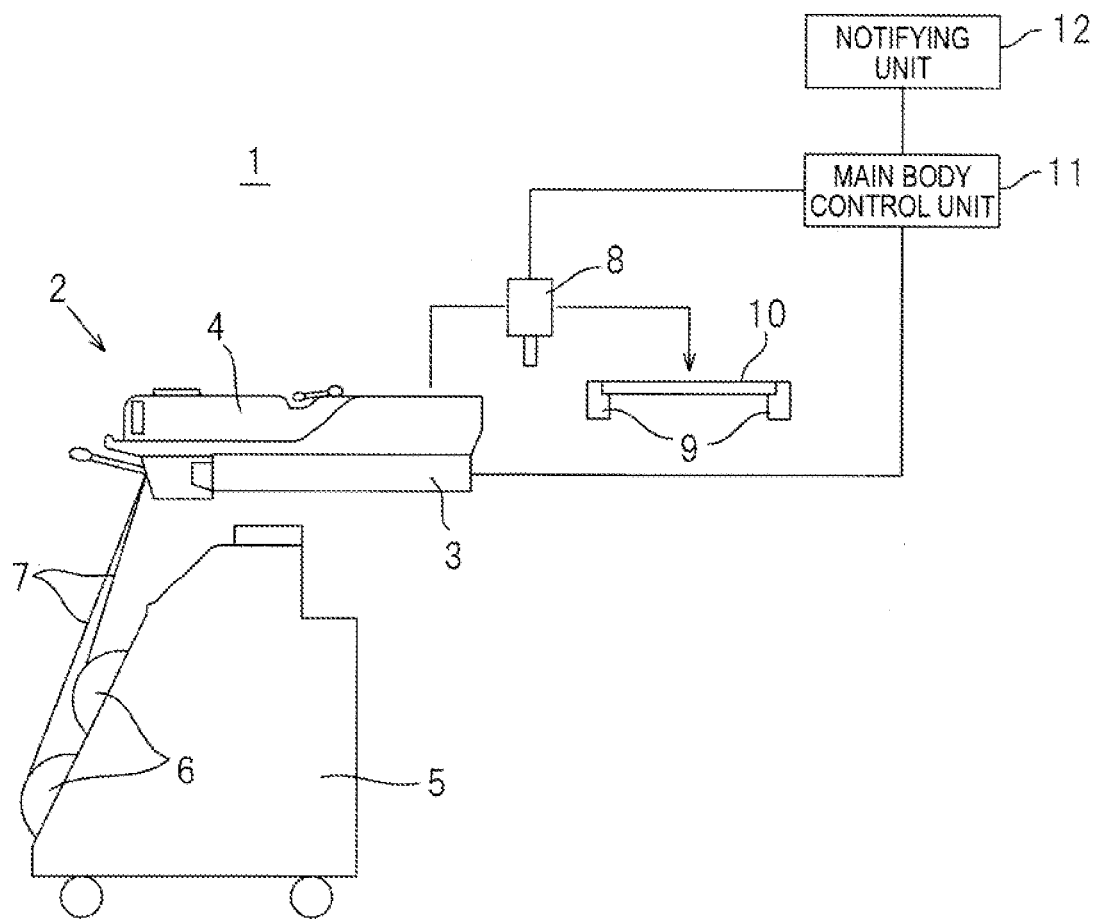
FIG. 1 is a partial cross sectional view of a component mounting device of an embodiment of the present invention.

An embodiment of the present invention is now described by reference to the drawings. First, a structure of a component mounting device is described by reference to FIG. 1. In FIG. 1, a component mounting device 1 has a component supply unit 2 that supplies components. A plurality of tape feeders 4 are arranged on an upper surface of a feeder base 3 provided in the component supply unit 2. The respective tape feeders 4 withdraw respective carrier tapes 7 holding components from a plurality of tape reels 6 set on a dolly 5 situated beneath the feeder base 3 and pitch-feed the thus-withdrawn carrier tapes, thereby supplying the held components to pickup positions of a mounting head 8.

The mounting head 8 is controlled by a main body control unit 11 and picks up a component from the tape feeder 4 of the component supply unit 2 and mounts the thus-picked-up component on a substrate 10 positioned on a conveyance path 9. The main body control unit 11 includes, as an attachment, a notifying unit 12 that uses a signal tower, a display panel, or the like. Under a command from the main body control unit 11, the notifying unit 12 notifies a machine operator of occurrence of an anomaly in operation of an individual unit of the component mounting device 1 or depletion of a component in the component supply unit 2, by means of an alarm lamp, an anomaly screen display, or the like.

Figure 2:
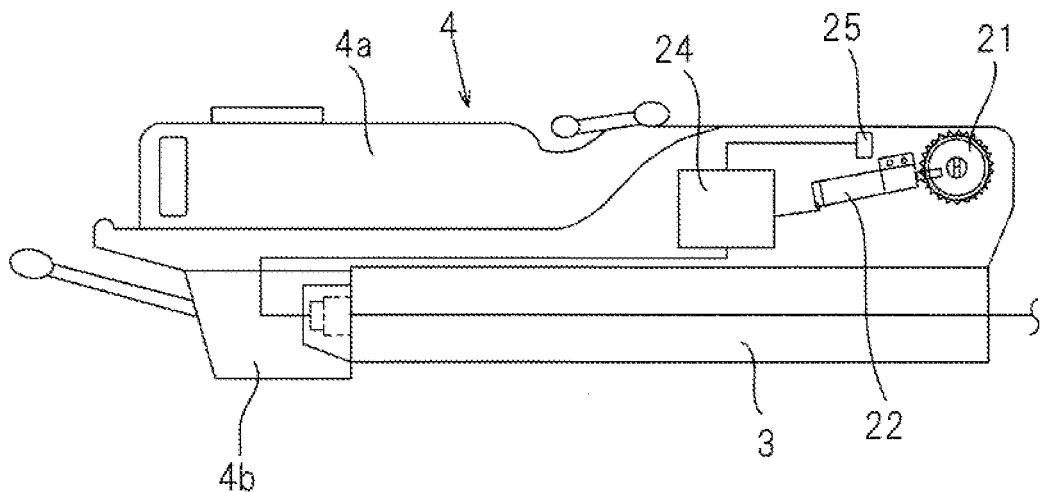
FIG. 2 is a side view of a tape feeder of the embodiment of the present invention.
Figure 3:
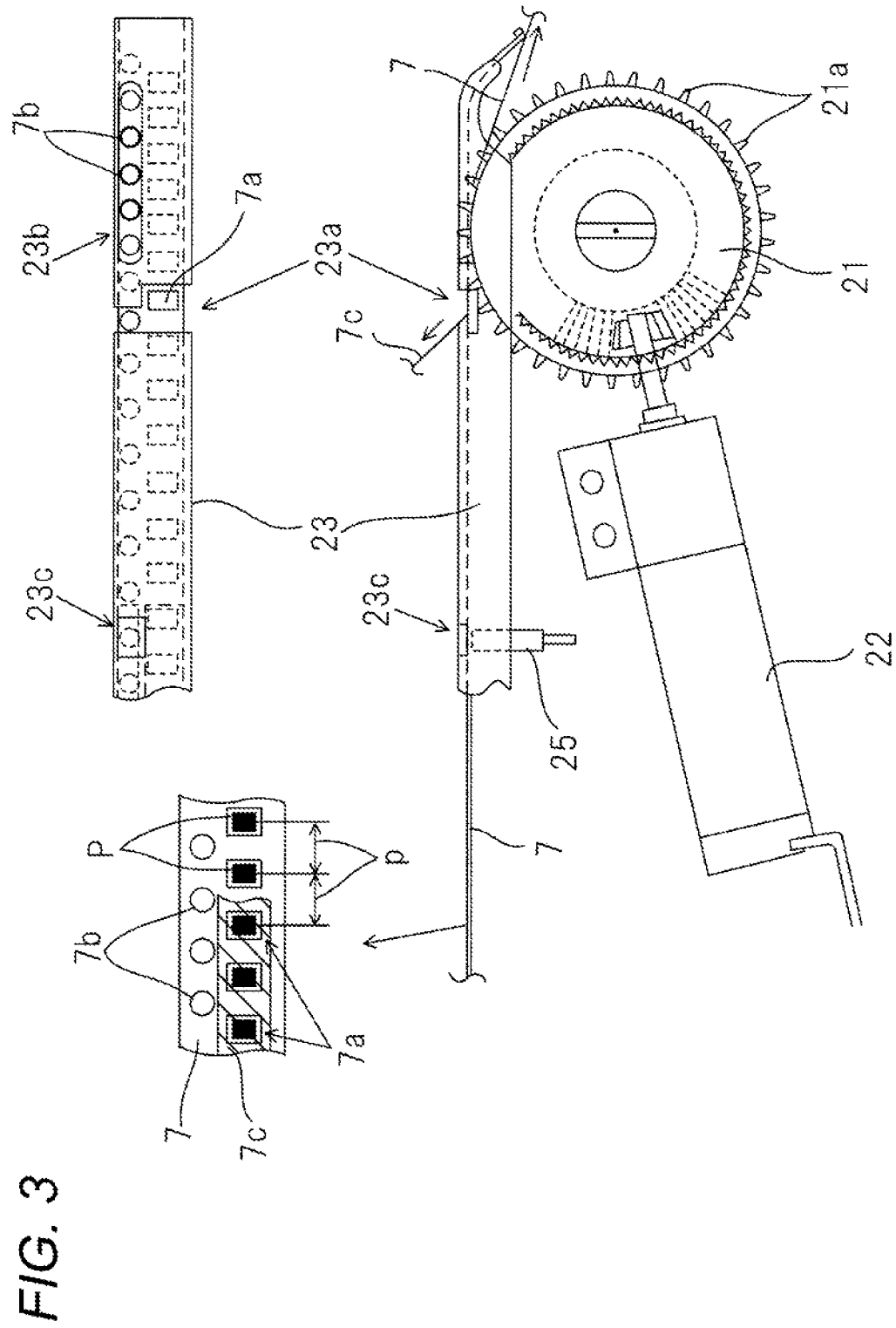
FIG. 3 is a structural explanatory view of a pickup position of the tape feeder of the embodiment of the present invention.

The tape feeder 4 is now described by reference to FIGS. 2, 3, and 4. In FIG. 2, each of the tape feeders 4 is positionally fixed by means of placing a lower surface of a main body 4a, which is an elongated frame member, on an upper surface of the feeder base 3 and bringing a lock portion 4b provided on the lower surface of the main body 4a into engagement with an end of the feeder base 3. In this state, a feeder controller 24 accommodated in the main body 4a is connected to the main body control unit 11 (FIG. 1) of the component mounting device 1 by way of a connector provided in the lock portion 4b. The feeder controller 24 is connected to a splice detection sensor 25 to be described later.

A sprocket 21 is placed at a front end (on a right side in FIG. 2) of each of the tape feeders 4. As shown in FIG. 3, feed pins 21a, or the like, that engage with feed holes 7b formed in the carrier tape 7 with a predetermined pitch for feeding a tape are provided at an equal pitch on an outer circumference of the sprocket 21. Moreover, a tooth flank that meshes with a bevel gear joined to an output shaft of a tape feed motor 22 is provided on a side surface of the sprocket 21.

The sprocket 21 is rotated by means of rotational driving of the tape feed motor 22, whereby the carrier tape 7 is fed. During tape feeding operation, the sprocket 21 performs intermittent rotational operation corresponding to a pitch feed pattern, thereby controlling rotation of the tape feed motor 22. Setting pitch-feed speed of the carrier tape 7 and positioning the carrier tape 7 are thereby performed. The tape feed motor 22 and the sprocket 21 make up a tape feed mechanism that pitch-feeds the carrier tape 7 with a predetermined pitch.

By means of tape feeding operation, the carrier tape 7 is withdrawn from the corresponding tape reel 6. The thus-withdrawn carrier tape 7 is guided to an interior of the tape feeder 4 from a tail end thereof and further fed forward along a tape feed path. A front end of the tape feeder 4 is set on a position where the mounting head 8 picks up a component. The thus-fed carrier tape 7 is pitch-fed while a space above the carrier tape 7 is covered with a cover member 23 provided above an upper surface of the carrier tape 7.

During the course of the carrier tape 7 being pitch-fed, a component P held in each of recesses 7a of the carrier tape 7 is picked up by the mounting head 8 by way of a notch 23a formed in the cover member 23. The notch 23a is situated at a pickup position where the mounting head 8 picks up the component P, to thus take the component out of the tape. A cover tape 7c affixed to the carrier tape 7 so as to cover the recesses 7a is peeled off at a position before the pickup position. As a result of removal of the cover tape, an exposed component P in the recess 7a is picked up by the mounting head 8 and mounted on the substrate 10.

A plurality of openings are provided before and after the notch 23a of the cover member 23. A groove 23b for letting the feed pins 21a escape is provided at a position that is forward of the notch 23a and that corresponds to the sprocket 21. Thus, the feed pins 21a projecting upward from the feed holes 7b of the carrier tape 7 are prevented from interfering with the cover member 23.

An optical sensor 25 is placed upstream of the notch 23a, and an opening 23c is provided immediately above the sensor 25. Light originating from the sensor 25 passes through the feed hole 7b of the carrier tape 7 and the opening 23c, thereby detecting the feed hole 7b. As will be described later, when the carrier tape 7 is fed beneath the cover member 23, a splice 34 [see FIGS. 6(a) and 6(b)] where the carrier tapes 7 are spliced together can be detected through detection of the feed hole.

Figure 6A:
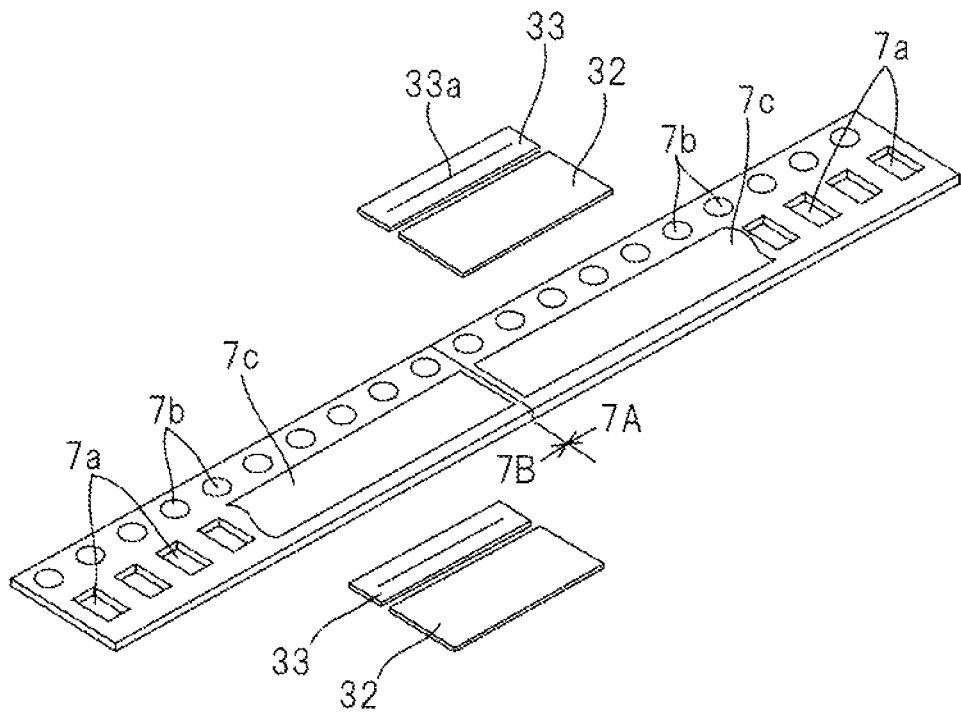
FIGS. 6(a) and 6(b) are descriptive views of tape splicing performed in the component mounting device of the embodiment of the present invention.
Figure 6B:
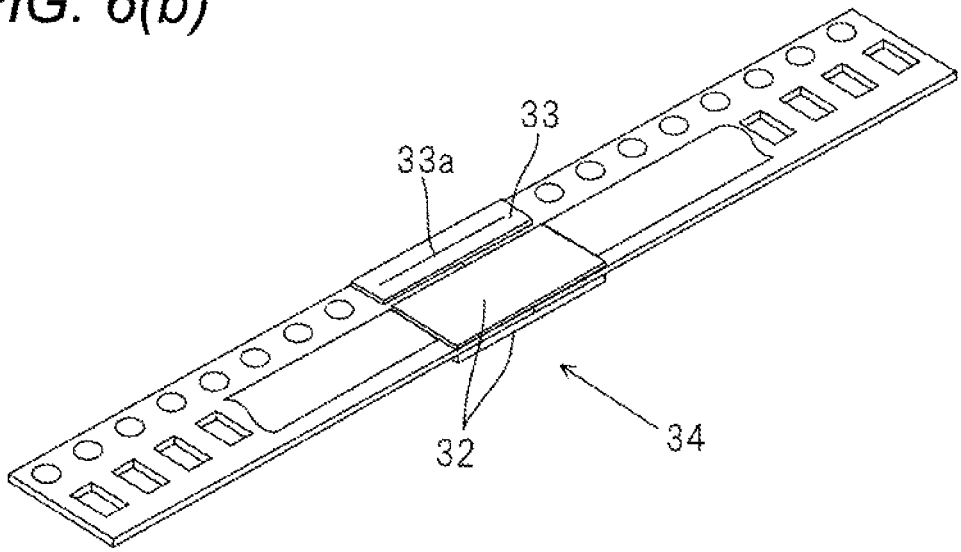

Splicing for splicing the carrier tapes 7 together is performed when components become depleted as a result of the carrier tape 7 accommodated in the tape reel 6 having run out during component mounting operation. Splicing is now described by reference to FIGS. 6(a) and 6(b). In FIGS. 6(a) and 6(b), reference numeral 7A denotes a carrier tape 7 already loaded, and reference numeral 7B denotes a new carrier tape 7 accommodated in the tape reel.

During tape splicing operation, a tail end of the carrier tape 7A and a head of the carrier tape 7B are caused to butt against one another by use of a custom-designed jig. A splicing adhesive tape 32 is affixed to both the front and back of a predetermined area on the carrier tapes 7 including a butt line. As a result, the two carrier tapes 7A and 7B are spliced together as shown in FIG. 6(b). By means of splicing operation, the carrier tape 7 is continually pitch-fed without interruption. There is therefore yielded an advantage of a necessity for halting mounting operation being obviated at the occasion of component supply.

In the component mounting device of the present embodiment, on occasion of splicing operation an adhesive tape 33 for closing feed holes is affixed onto the feed holes 7b situated in the vicinity of the butt line, in addition to adhesion of the adhesive tape 32 for splicing tapes. A slit 33a is formed in the adhesive tape 33 along its longitudinal direction. When the feed pins 21a of the sprocket 21 fit into the respective feed holes 7b from below, the feed pins 21a can project upwardly through the slits 33a and are prevented from hindering tape feed.

Figure 7A:
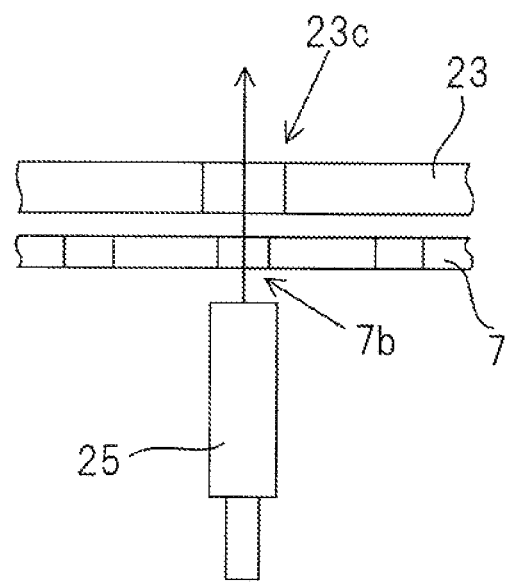
FIGS. 7(a) and 7(b) are descriptive views of splice detection in the component mounting device of the embodiment of the present invention.
Figure 7B:
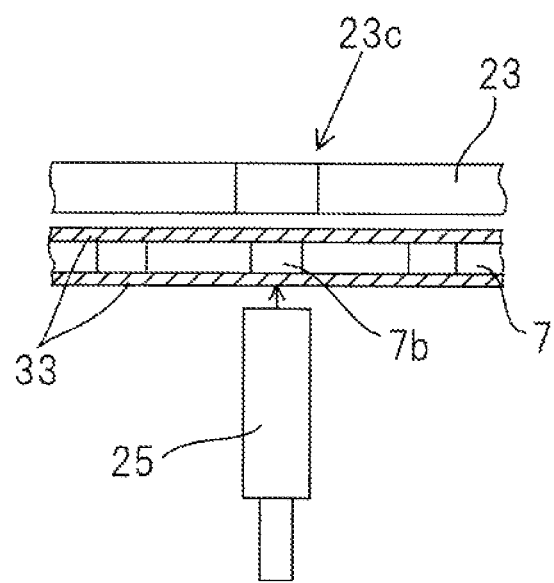
Figure 8:
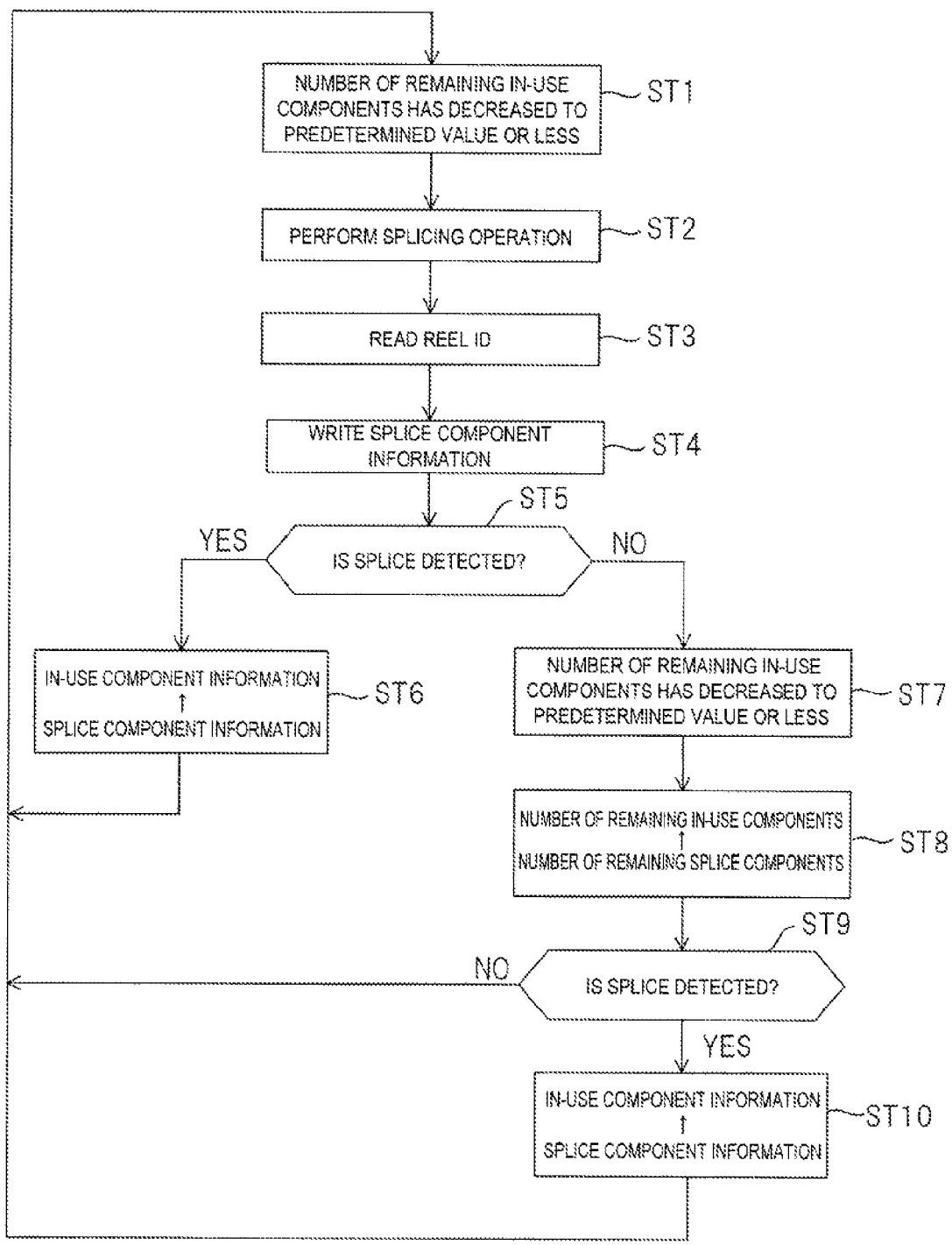
FIG. 8 is a flowchart of processing for rewriting component information under a component mounting method of the embodiment of the present invention.

Closing the feed holes is practiced with a view toward distinguishing the splice 34 from the other portions of the carrier tapes in such a way that the splice 34 where the carrier tapes 7A and 7B are spliced together can be automatically detected by utilization of the feed holes 7b. Specifically, when normal portions of the carrier tapes 7 pass over the sensor 25, the light originating from the sensor 25 passes, in an upward direction, through the feed hole 7b and the opening 23c at timing when the feed hole 7b comes to a position between the sensor 25 and the opening 23c, as shown in FIG. 7(a), whereupon the feed hole is detected. A feed hole detection signal is repeated at an interval corresponding to the feed hole pitch, to thus be output. On the contrary, when the splice 34, where the feed holes 7b are closed by the adhesive tape 33, passes over the sensor 25, the feed holes 7b corresponding to an area where the adhesive tape 33 is affixed to the tape are not detected. Therefore, it is detected that the splice 34 that splices the carrier tapes 7 together has passed by the position of the sensor 25 by means of continually monitoring the feed hole detection signal from the sensor 25.

By reference to FIG. 4, a configuration of the feeder controller 24 is now described. The feeder controller 24 is configured so as to control units to be described below by means of a feed control unit 26 in accordance with a control signal from the main body control unit 11. A motor drive unit 27 drives the tape feed motor 22. A splice detection unit 28 detects that the splice 34 where the tapes are spliced by splicing operation has passed by the position of the sensor 25 according to the feed hole detection signal from the sensor 25. A tape information reading unit 29 reads tape information read by a barcode reader 30, in other words, information about a barcode label affixed to the tape reel 6. Component information, such as read component names, is stored in a component information storage unit 31.

As shown in FIG. 5, the component information storage unit 31 has an in-use component information memory area 31a and a splice component information memory area 31b. In-use component information (first component information) about components to be used, that is, components that are present in a downward area (i.e., an area close to the tape feeder 4) with respect to the splice 34 and that are now used is written into the in-use component information memory area 31a. Splice component information (second component information) about splice components, that is, components that are located in an upstream area (i.e., an area close to the tape reel 6) with respect to the splice 34 is written into the splice component information memory area 31b.

Component information is herein configured so as to include a number of remaining component representing the number of components held by the carrier tape 7 at a certain point in time, component names representing information about types of components, and a reel ID that is an identification code for specifying each of the tape reels 6. In the example shown in FIG. 5, stored component information relates to two tape reels 6, a tape reel 6 with a reel ID xxxx and a tape reel 6 with a reel ID yyyy, which each have carrier tapes 7 holding a component type (component name A) assigned to the respective tape feeders 4 that is to be fed. Specifically, a number of remaining component N and a component name A pertaining to components still remaining on the previously set carrier tape with the reel ID xxxx are stored as in-use component information. Since the components are not yet consumed, the rated number of components (10000 components in this case) of the carrier tape and the component name A are stored as splice component information.

More specifically, the component information storage unit provided in the component mounting device 1 described in connection with the embodiment individually stores first component information including at least a number of remaining component and component type information held on the carrier tape 7 already loaded and second component information including at least a number of remaining component and component type information held in a newly-supplied carrier tape 7. In addition to the items mentioned above, various types of information available for managing production, such as a splicing execution time and date for specifying timing at which splicing operation is performed, can also be added as the component information. By means of addition of such information, it becomes possible to acquire useful history tracking information about the components already loaded when a problem has occurred in a subsequent step.

The present embodiment illustrates an example in which the splice detection unit 28, the tape information read unit 29, and the component information storage unit 31 are configured as processing functions of the feeder controller 24. However, the functions may also be configured so as to be imparted to the main body control unit 11. In this case, the main body control unit 11 detects a feed hole detection signal from the sensor 25, thereby detecting that the splice has passed by the position of the sensor 25. The tape information read by the barcode reader 30 is read by the main body control unit 11 and written into a storage device provided in the main body control unit 11.

The component mounting device is configured as mentioned above, and a component supply method practiced by the component mounting device is now described. Under the component supply method, the carrier tapes 7 are loaded into the respective tape feeders 4 arranged in the component supply unit 2. Each of the tape feeders 4 pitch-feeds the carrier tape 7 while repeatedly performing splicing operation for splicing the carrier tape 7 already loaded and a carrier tape 7 to be newly fed together, whereby components are fed to the pickup position for the mounting head 8. Component information rewrite processing performed in association with splicing operation is now described.

During mounting operation for picking up a component from each of the tape feeders 4 by means of the mounting head 8 and mounting the thus-picked-up component on the substrate 10, the number of remaining component stored in the in-use component information memory area 31a of the component information storage unit 31 is updated in real time. At a point in time (ST1) when the number of remaining component has decreased to a predetermined value Nm specified in correspondence to timing at which the carrier tape 7 is to be spliced to the next carrier tape 7, the notifying unit 12 issues a component depletion alarm. Specifically, in the present embodiment, when the number of remaining component of the carrier tape 7 in the first component information has decreased to a predetermined value, the notifying unit 12 works as a component depletion notifying unit that issues a component depletion alarm.

Figures 9A, 9B, 9C, 9D, 9E, 9F, 9G:
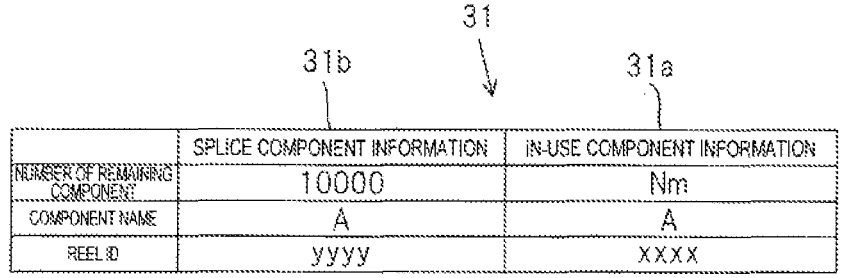
FIGS. 9(a) to 9(g) are descriptive views of processing for rewriting component information under the component mounting method of the embodiment of the present invention.

The machine operator received the alarm performs splicing operation for splicing the carrier tape 7 already loaded to a newly supplied carrier tape 7 (a splicing operation step) (ST2). After performance of splicing operation, the barcode reader 30 (FIG. 4) reads a reel ID of the barcode label affixed to the tape reel 6 into which the carrier tape is to be newly loaded (ST3). Component information included in a barcode is written as component information about a splice component into the splice component information memory area 31b of the component information storage unit 31 (a component information write step) (ST3). As shown in FIG. 9(a), a reel ID yyyy of the tape reel 6 into which a carrier tape is to be newly loaded, a component name A, and a value of number of component 10000 achieved when a tape reel remains unused are written into the splice component information memory area 31b of the component information storage unit 31. The number of remaining component Nm and the component name A, both of which pertain to the reel ID xxxx of the tape reel already loaded with the carrier tape and which are acquired at that point in time, are stored in the in-use component information memory area 31a at this time.

Even in the middle of performance of processing related to such splicing operation, tape feed operation for pitch-feeding the carrier tape 7 to feed a component is being continually performed. In the course of tape feed operation, the splice detection unit 28 monitors detection of the splice 34 (a splice detection step) (ST5). When the splice 34 is detected, there is performed processing for writing the splice component information (the second component information) over the in-use component information (the first component information) (a component information rewrite step) (ST6). As shown in FIG. 9(b), this lets component information about the reel ID yyyy migrate to the in-use component information memory area 31a. From then on, the carrier tape 7 with reel ID yyyy starts supplying components, and processing returns to (ST1), where the number of remaining component is continually monitored. When the number of remaining component has decreased to a predetermined value or less, similar operation processing is repeatedly performed.

On the contrary, when the splice 34 is not detected in (ST6), processing provided below is carried out. During detection of the splice 34 performed by use of the sensor 25, the splice 34 may not be reliably detected depending on optical transparency of an adhesive tape used for splicing and a condition of sensitivity adjustment of the sensor 25. In such a case, heretofore, the component information storage unit 31 has not performed the component information rewrite operation described in connection with (ST6). Therefore, the in-use component information still remains unchanged, such as that shown in FIG. 9(a). For this reason, the component depletion alarm is not canceled and remains issued, so that the component mounting device is halted.

In order to prevent deterioration of the availability factor of the component mounting device caused by stoppage of the component mounting device, the following processing is performed even when the splice 34 is not detected in (ST6) in the present embodiment, whereby component supply operation is continually performed without halting the component mounting device. Specifically, at a point in time when the number of remaining component in the in-use component information memory area 31a has decreased to or less than the predetermined value that is set to a value smaller than the predetermined value Nm corresponding to timing at which the splicing operation is to be performed, only the number of remaining component of the in-use component information in the in-use component information memory area 31a is rewritten by the number of remaining component of the splice component information in the splice component information memory area 31b (ST8).

Specifically, when the splice 34 is not detected and when the number of remaining component in the in-use component information has decreased to the predetermined value, only the number of remaining component of the in-use component information is rewritten by the number of remaining component of the splice component information without issuing a component depletion alarm as shown in FIG. 9(c) (a limited component information rewrite step). The number of remaining component in the in-use component information memory area 31a greatly exceeds the predetermined value serving as a criterion for a component depletion alarm, and component supply operation can be continually performed without issuance of the component depletion alarm.

The number of components held in a carrier tape of one tape reel is not rigorously managed. Overs and shorts of components of the order of ±100 fall within a normal range of variations. Therefore, even when the splice 34 is determined not to be detected in (ST6), the splice 34 may be detected after elapse of a slight time. For this reason, detection of the splice 34 is monitored after performance of processing pertaining to (ST8) (ST9). When the splice 34 is detected, the in-use component information is rewritten by the splice component information as shown in FIG. 9(e). Rewriting of the number of remaining component has already been performed (ST8) at this time, and hence only the component name and the reel ID become objects of rewriting. Specifically, when the splice 34 is detected after the limited component information rewrite step, the splice component information is written over the in-use component information except the number of remaining component.

When the splice 34 is not detected in (ST9), the component supply operation is continually performed without interruption, whereby only the number of remaining component of the in-use component information in the component information shown in FIG. 9(d) decreases. When components are continually fed in this state, the number of remaining component in the in-use component information memory area 31a gradually decreases as shown in FIG. 9(f). Subsequently, when the number of remaining component has decreased to the predetermined value Nm that is an object of a component depletion alarm (ST1), splicing operation intended for the next tape reel 6 is performed (ST2).

The component information except the number of remaining component pertaining to the reel ID yyyy is retained, as it is, in the splice component information memory area 31b. However, in (ST4), the component information about a tape reel (a reel ID zzzz) that is the next object of supply operation is written, as it is, over the splice component information memory area 31b as shown in FIG. 9(g). Specifically, when the number of remaining component in the in-use component information has decreased to a predetermined value in the limited component information rewrite step, there is performed processing for writing component information about the carrier tape 7 to be next fed over the splice component information in the splice component information memory area 31b.

In FIG. 9(g), in relation to the reel ID of the in-use component information memory area 31a, the reel ID stored in steps shown in FIGS. 9(d) and 9(g) is still retained as it is. However, in reality, the carrier tape 7 with the reel ID yyyy is now taken as an object of component supply. Therefore, it is also possible to shift the reel ID yyyy of the splice component information memory area 31b to the in-use component information memory area 31a. However, when rigorous management of traceability is not required, it is not necessary to move the reel ID on purpose.

As mentioned above, the component supply method for the component mounting device described in connection with the present embodiment is arranged so as to include: detecting the splice 34 caused by splicing operation in the course of performance of tape feed operation for supplying a component by pitch-feeding the carrier tape 7; writing splice component information over in-use component information when the splice 34 is detected; and rewriting only the number of remaining component of the in-use component information by means of the number of remaining component of the splice component information without issuing a component depletion alarm when the splice 34 is not normally detected and when the number of remaining component in the in-use component information has decreased to a predetermined value showing that timing at which component depletion occurs has approached. Even when erroneous detection of the splice 34 in the carrier tape 7 has occurred after normal performance of splicing operation, operation of the component mounting device can be continually performed.

Although the present invention has been described in detail and by reference to the specific embodiment, it is manifest to those skilled in the art that the present invention be susceptible to various alterations and modifications without departing the spirit and scope of the invention.

The present patent application is based on Japanese Patent Application (JP-2010-095686) filed on Apr. 19, 2010, the entire subject matter of which is incorporated herein by reference.

INDUSTRIAL APPLICABILITY

The component supply method for the component mounting device of the present invention provides an advantage of the ability to maintain continual performance of the device even when erroneous detection of a splice in a carrier tape has occurred, to be able to maintain an availability factor of the device. The invention is useful for a component supply method for picking up a component from a tape feeder of a component supply unit and supply the picked-up component to the mount head.

DESCRIPTION OF REFERENCE SIGNS

1: COMPONENT MOUNTING DEVICE
2: COMPONENT SUPPLY UNIT
4: TAPE FEEDER
7: CARRIER TAPE
8: MOUNT HEAD
10: SUBSTRATE
24: FEEDER CONTROLLER
31a: IN-USE COMPONENT INFORMATION MEMORY AREA
31b: SPLICE COMPONENT INFORMATION MEMORY AREA
34: SPLICE
P: COMPONENT

The invention claimed is:

1. A component supply method in a component feeding device that picks up a component from a component supply unit by a mount head and that mounts the component on a substrate, in which a carrier tape which holds the components is loaded into a tape feeder arranged in the component supply unit and the carrier tape is pitch-fed while splicing operation for splicing a carrier tape already loaded and a carrier tape to be newly fed in the tape feeder is repeatedly performed, whereby the component is supplied to a pickup position for the mount head, the component mounting device comprising: a splice detection unit configured to detect a presence of a splice made through splicing performed during the splicing operation; a component information storage unit configured to individually store first component information comprising a number of remaining component and component type information of components held in the carrier tape already loaded and second component information comprising a number of remaining component and component type information of components held in a carrier tape to be newly fed; and a component depletion notifying unit configured to issue a component depletion alarm when the number of remaining component of the carrier tape in the first component information has decreased to a first predetermined value specified in correspondence to timing at which the carrier tape is to be spliced, said method comprising:

detecting the presence of the splice in a tape feed process of pitch-feeding the carrier tape to supply the component;

performing a component information rewrite process in which the first component information is overwritten with the second component information when the presence of the splice is detected; and performing a limited component information rewrite process in which only the number of remaining component of the first component information is overwritten with the number of remaining component of the second component information without issuing the component depletion alarm when the presence of the splice is not detected and when the number of remaining component in the first component information has decreased to a second predetermined value that is smaller than the first predetermined value.

2. The component supply method in the component mounting device according to claim 1, wherein when the presence of the spice is detected after the limited component information rewrite process is performed, the first component information is overwritten with the second component information except the number of remaining component.

3. The component supply method in the component mounting device according to claim 1, wherein when the number of remaining component in the first component information has decreased to the first predetermined value after the limited component information rewrite process is performed, the second component information is overwritten by component information about a carrier tape to be next fed.

* * * * *